United States Patent [19]
Woo

[11] Patent Number: 5,227,679
[45] Date of Patent: Jul. 13, 1993

[54] CMOS DIGITAL-CONTROLLED DELAY GATE

[75] Inventor: Ann K. Woo, Cupertino, Calif.

[73] Assignee: Advanced Micro Devices, Inc., Sunnyvale, Calif.

[21] Appl. No.: 815,791

[22] Filed: Jan. 2, 1992

[51] Int. Cl.⁵ ...................... H03K 19/94; H03K 19/20
[52] U.S. Cl. .................................. 307/469; 307/451; 307/594; 307/602
[58] Field of Search ............... 307/465, 468, 469, 594, 307/599, 602, 605, 606, 451

[56] References Cited

U.S. PATENT DOCUMENTS

| | | | |
|---|---|---|---|
| 4,593,203 | 6/1986 | Iwahashi | 307/469 |
| 4,719,369 | 1/1988 | Asano et al. | 307/451 |
| 4,806,804 | 2/1989 | O'Leary | 307/469 |
| 4,899,071 | 2/1990 | Morales | 307/602 |
| 5,012,141 | 2/1990 | Tomisawa | 307/594 |
| 5,118,971 | 6/1992 | Schenck | 307/468 |

*Primary Examiner*—Edward P. Westin
*Assistant Examiner*—Andrew Sanders
*Attorney, Agent, or Firm*—Davis Chin

[57] ABSTRACT

A CMOS digital-controlled delay gate is provided in which the propagation delay time can be precisely controlled by digital select control signals. The delay gate includes an inverter circuit section (12) formed of a plurality of CMOS inverters (12a-12n) each inverter having a P-channel transistor and an N-channel transistor and a control logic section (14, 16) which is responsive to the digital select control signals for changing the ratio of the total P-channel transistor size to the total N-channel transistor size in the enabled transistors. The input threshold voltage of the inverter circuit section is selectively changeable so as to produce a controllable propagation delay.

18 Claims, 2 Drawing Sheets

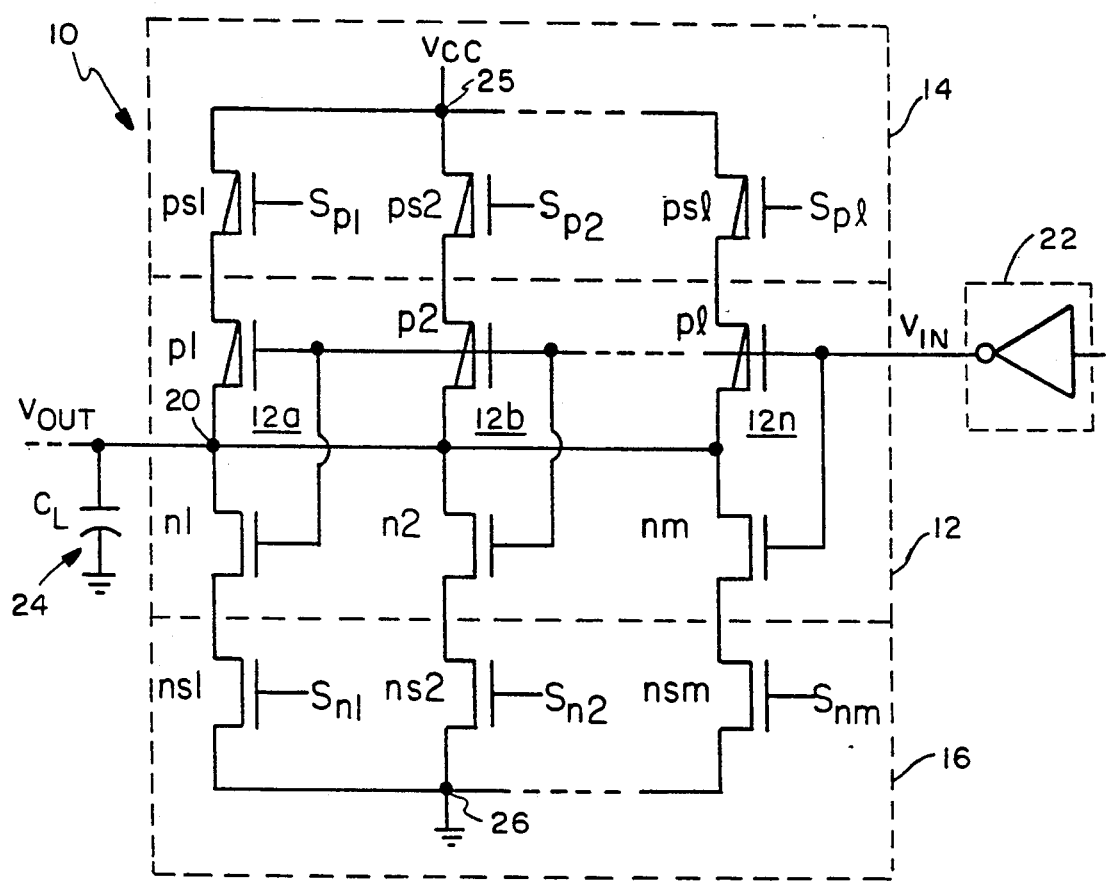
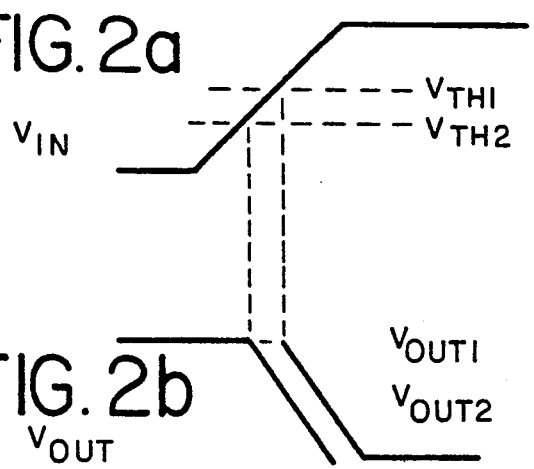

|     | S5 | S4 | S3 | S2 | S1 | APPROXIMATE p/n RATIO |
|-----|----|----|----|----|----|----|
| (1) | L | L | H | H | H | 24/12 |
| (2) | L | H | L | H | H | 24/13 |
| (3) | H | L | L | H | H | 24/14 |
| (4) | L | H | H | H | L | 24/15 |
| (5) | H | L | H | H | L | 24/16 |
| (6) | H | H | L | H | L | 24/17 |
| (7) | H | H | H | L | L | 24/18 |
| (8) | H | L | H | H | H | 24/19 |
| (9) | H | H | L | H | H | 24/20 |
| . | . | . | . | . | . | . |
| . | . | . | . | . | . | . |
| . | . | . | . | . | . | . |
| . | . | . | . | . | . | . |

CMOS DIGITAL-CONTROLLED DELAY GATE

DESCRIPTION

Background of the Invention

This invention relates generally to electrical time delay circuits and more particularly, it relates to a CMOS digital-controlled delay gate whose propagation delay time can be precisely controlled by digitally selected control signals.

Heretofore, there are known in the prior art conventional circuits formed of inductances, capacitances, and resistances referred to sometimes as "analog circuits" which are used to achieve accuracy in timing but are very sensitive to noise. Further, there also exists prior art delay line circuits of the type which utilize digital electronic circuitry such as inverters and logic circuits so as to control the time delay. However, these prior art digital delay line circuits suffer from the disadvantage of not being able to provide a high accuracy. In addition, such conventional digital delay lines do not have the capability of allowing the user to select precisely the desired amount of time delay.

As is generally known, a conventional CMOS inverter may be used to form a delay element and is comprised of a P-channel MOS transistor and an N-channel MOS transistor. The gates of the P-channel and N-channel transistors are connected together so as to define the input of the inverter, and the drains thereof are connected together so as to define the output of the inverter. The source of the P-channel transistor is connected to a positive supply voltage or potential VDD, and the source of the N-channel transistor is connected to a ground potential VSS. When an input signal having a predetermined waveform is applied to the input of the inverter, an output signal appearing at the output of the inverter is delayed. This propagation delay is normally dependent upon the loading connected to the inverter output. For example, when the load is capacitive the delay is due to the charging and discharging of the capacitor. Thus, when the load is larger, the propagation delay will be longer.

It is also known that the input threshold voltage of the CMOS inverter is a function of the ratio of the size of the P-channel transistor to the size of the N-channel transistor. In other words, a higher ratio will cause the input threshold voltage to be higher, and a lower ratio will cause the input threshold voltage to be lower. Therefore, by changing this ratio the input threshold voltage of the inverter the amount of propagation delay can thus be varied. The inventor has discovered a way of utilizing this principle so as to provide the gate delay of the present invention.

It would thus therefore be desirable to provide a CMOS digital-controlled delay gate which is insensitive to noise and which has a delay time of high accuracy and high stability. In addition, it would be expedient to have the precise amount of delay time capable of being digitally selected by the users. The present invention may be implemented in a variety of circuit applications. Such applications include, but are not limited to, inverters, delay lines, and output buffers wherein a time signal having a particular waveform is required to be precisely controlled. In particular, the instant invention is useful for digital controlled fine-tuning of a timing control circuit.

SUMMARY OF THE INVENTION

Accordingly, it is a general object of the present invention to provide a CMOS digital-controlled delay gate which is relatively simple and economical to manufacture and assembly, but yet overcomes the disadvantages of the prior art delay line circuits.

It is an object of the present invention to provide a CMOS digital-controlled delay gate whose propagation delay time can be precisely controlled by digitally selected control signals.

It is another object of the present invention to provide a CMOS digital-controlled delay gate which is insensitive to noise and which has a delay time of high accuracy and high stability.

It is still another object of the present invention to provide a CMOS digital-controlled delay gate which includes an inverter circuit section formed of a plurality of P-channel and N-channel transistors and having a variable input threshold voltage which is substantially determined by the ratio of the total P-channel transistor size to the total N-channel transistor size of the enabled transistors.

It is still yet another object of the present invention to provide a CMOS digital-controlled delay gate which includes an inverter circuit section formed of a plurality of P-channel and N-channel transistors and a control logic circuit responsive to digital select signals having a number of different codes for selectively enabling certain ones of the P-channel and N-channel transistors in order to vary the input threshold voltage of the inverter circuit section.

In accordance with these aims and objectives, the present invention is concerned with the provision of a CMOS digital-controlled delay gate which includes an inverter circuit section, a plurality of upper gating transistors, and a plurality of lower gating transistors.

The inverter circuit section has its input connected to an input node for receiving an input logic signal and its output connected to an output node for generating an output logic signal. The inverter circuit section is formed of a plurality of P-channel transistors and a plurality of N-channel transistors. Each of the plurality of P-channel transistors and N-channel transistors have predetermined sizes.

The plurality of upper gating transistors have their conduction paths connected between a power supply potential and a respective source electrode of the P-channel transistors of the inverter circuit section. Each of the plurality of upper gating transistors has its gate connected to receive a corresponding one of first digital select signals. The plurality of lower gating transistors have their conduction paths connected between a ground potential and a respective source electrode of the N-channel transistors of the inverter circuit section. Each of the plurality of lower gating transistors has its gate connected to receive a corresponding one of second digital select signals.

The first and second digital select signals have respective first and second numbers of different codes for selectively and independently turning on certain ones of the upper gating transistors and certain ones of the lower gating transistors so as to enable selected ones of the plurality of P-channel and N-channel transistors. The inverter circuit section has a variable input threshold voltage which is substantially determined by the ratio of the total P-channel transistor size to the total N-channel transistor size of the enabled transistors so that the output logic signal has a controllable propagation delay relative to the input logic signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic circuit diagram of a CMOS digital-controlled delay gate, constructed in accordance with the principles of the present invention;

FIGS. 2(a) and 2(b) are waveforms useful in understanding the operation of FIG. 1.

DESCRIPTION OF THE PREFERRED EMBODIMENT

Figures 3A, 3B:
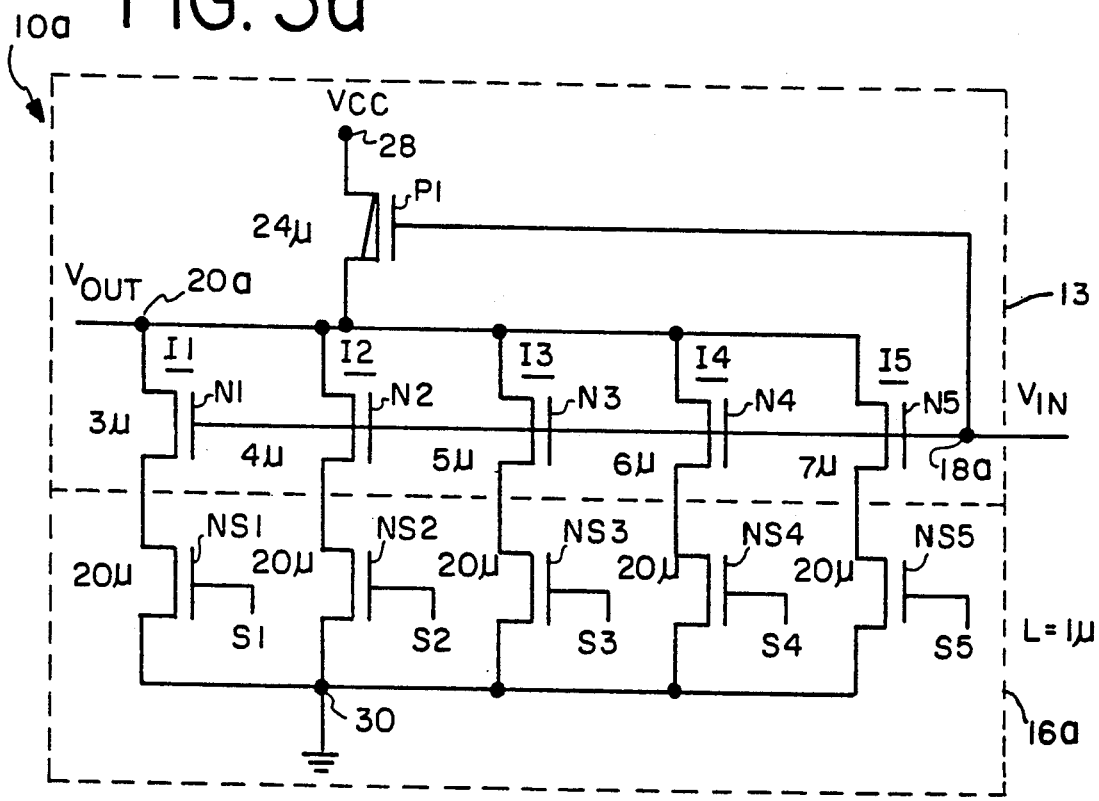
FIGS. 3(a) and 3(b) are a schematic circuit diagram of a second embodiment of a delay gate of the present invention and an associated truth table to illustrate the operation thereof, respectively.

Referring now in detail to the drawings, there is shown in FIG. 1 a schematic circuit diagram of a CMOS digital-controlled delay gate 10 which is constructed in accordance with the principles of the present invention. The delay gate 10 is comprised of an inverter circuit section 12, an upper control logic section 14, and a lower control logic section 16. The inverter circuit section 12 has an input node 18 and an output node 20. The input node 18 is connected to receive an input logic signal $V_{in}$ having a particular waveform from the output of a signal source, such as a buffer 22. The output node 20 is connected to a load 24 which is represented by a capacitor $C_L$. One end of the capacitor is connected to the output node 20, and the other end of the capacitor is connected to a ground potential. An output logic signal $V_{out}$ appearing at the output node 20 is inverted and delayed with respect to the input logic signal $V_{in}$. The amount of propagation delay from the input node 18 to the output node 20 is digitally controlled with a high accuracy, as will be more fully described hereinafter.

The inverter circuit section 12 includes a plurality of parallel-connected CMOS inverters 12a, 12b, ... 12n each being formed of a P-channel MOS transistor and an N-channel MOS transistor. For example, the inverter 12a includes a P-channel MOS transistor p1 and an N-channel MOS transistor n1 whose gates are connected together to form an input and whose drains are connected together to form an output. The inverter 12b includes a P-channel MOS transistor p2 and an N-channel MOS transistor n2 whose gates are connected together to form its input and whose drains are connected to form its output. Finally, the inverter 12n includes a P-channel MOS transistor pl and an N-channel MOS transistor nm whose gates are connected together to form its input and whose drains are connected together to form its output.

It will be noted that the inputs of each of the inverters 12a, 12b, ... 12n are connected together and to the input node 18 for receiving the input logic signal $V_{in}$. The outputs of each of the inverters 12a-12n are connected together and to the output node 20 for generating the output logic signal $V_{out}$. The inverter circuit section 12 has a propagation delay dependent upon its input threshold voltage. However, the input threshold voltage of the inverter section 12 is a function of the ratio of the total P-channel transistor size to the total N-channel transistor size. In other words, a higher ratio will provide a higher input threshold voltage, and a smaller ratio will provide a smaller input threshold voltage. Therefore, this ratio can be changed for the inverter circuit section 12 by selecting different sizes for the P-channel transistors (p1-pl) and the N-channel transistors (n1-nm) in order to obtain the desired propagation delay.

The upper control logic section 14 is comprised of a plurality of upper gating or switching transistors ps1, ps2, ... ps1. The conduction path of each of the upper gating transistors is connected between a power supply potential or voltage VCC at node 25 and a respective one of the P-channel transistors of the inverter circuit section 12. In particular, the gating transistor ps1 has its source electrode connected to the power supply potential VCC and its drain electrode connected to the source electrode of the P-channel transistor p1. The gating transistor ps2 has its source electrode connected also to the power supply potential and its drain electrode connected to the source electrode of the P-channel transistor p2. Similarly, the gating transistor psl has its source electrode connected also to the power supply potential and its drain electrode connected to the source electrode of the P-channel transistor pl.

The gates of each of the gating transistors ps1-ps are connected to receive one of respective first digital select control signal Sp1, Sp2, ... Spl. Each of the digital select signals Sp1-Spl may be either at a high or low logic level so as to provide a first number of different codes. Further, the sizes of the gating transistors ps1-psl are made to be large so that when they are turned on their series resistances are quite negligible.

The lower control logic section 16 is comprised of a plurality of lower gating or switching transistors ns1, ns2, ... nsm. The conduction path of each of the lower gating transistors is connected between a respective one of the N-channel transistors of the inverter circuit section 12 and the ground potential at node 26. In particular, the gating transistor ns1 has its drain electrode connected to the source electrode of the N-channel transistor n1 and its source electrode connected to the ground potential. The gating transistor ns2 has its drain electrode connected to the source electrode of the N-channel transistor n2 and its source electrode also connected to the ground potential. Similarly, the gating transistor nsm has its drain electrode connected to the source electrode of the N-channel transistor nm and its source electrode connected also to the ground potential.

The gates of each of the gating transistors nsl-nsm are connected to receive one of the respective second digital select control signals Sn1, Sn2, ... Snm. Each of the second digital select signals Snl-Snm may be either at a high or low logic level so as to provide a second number of different codes and are completely independent of the respective first digital select signals Sp1-Spl. Again, the sizes of the gating transistors nsl-nsm are made to be large so that when they are turned on their series resistances are quite negligible.

For example, assume that the digital select signal Sp1 is at a low logic level and the digital select signal Sn1 is at a high logic level. As a result, the upper gating transistor psl and the lower gating transistor nsl will both be turned on so as to enable the transistors pl and nl to be responsive to the input logic signal $V_{in}$. Assume that the digital select signal Sp2 is at the low logic level and the digital signal Sn2 is at the high logic level. Consequently, the upper gating transistor ps2 and the lower gating transistor ns2 will be rendered conductive so as to enable the transistors p2 and n2 to be responsive to the input signal $V_{in}$. Similarly, when the digital select signal Spl is at the low logic level and the digital select signal Snm is at the high logic level, the upper and lower gating transistors psl and nsm will both be turned on so as to enable the transistors pl and nm to be responsive to the input signal $V_{in}$.

However, it should be apparent to those skilled in the art that dependent upon the independent selection of the first and second numbers of different codes for the respective first and second digital select signals certain ones of the upper and lower gating transistors will be turned on so that at least one of the plurality of transistors p1-pl and at least one of the plurality of transistors n1-nm will be enabled. In this manner, the input threshold voltage can be changed since it is established by the ratio of the total P-channel transistor size to the total N-channel transistor size of the enabled transistors in order to produce a controllable propagation delay. In other words, the variable input threshold voltage $V_{TH}$ of the inverter circuit section 12 is substantially determined by:

$$V_{TH} = f\left[\frac{\Sigma p_x}{\Sigma n_x}\right]$$

where p0 $P_x$ = total P-channel transistor size of enabled P-channel transistors.

$n_x$ = total N-channel transistor size of enabled N-channel transistors.

In order to understand the operation of the delay gate of FIG. 1, reference is made to FIGS. 2(a) and 2(b). In FIG. 2(a), there is illustrated a waveform of the input logic signal $V_{in}$ making a low-to-high transition. The point $V_{TH1}$ represents the input threshold voltage of the inverter circuit section 12 for a first set of codes for the first and second digital select signals. The point $V_{TH2}$ represents the input threshold voltage of the inverter circuit section 12 for a second set of codes for the digital select signals. It will be noted that the first input threshold voltage $V_{TH1}$ is shown to be greater than that of the second input threshold voltage $V_{TH2}$. Therefore, when the input logic signal makes the low-to-high transition and the inverter section 12 receives the second set of codes for the digital signals corresponding to the smaller ratio, the output signal $V_{out}$ will change sooner than when the inverter circuit section 12 receives the first set of codes for the digital select signals corresponding to the higher ratio.

This is because the enabled N-channel transistors in the inverter circuit section will be turned on sooner. This output signal $V_{out}$ is illustrated in FIG. 2(b). As a result, the input threshold voltage $V_{TH2}$ corresponding to the lower ratio will have a smaller propagation delay. In actual practice, it has been found that with a one micron CMOS technology process an increment or decrement of approximately 10 ps in the propagation delay time of the circuit of FIG. 1 can be achieved.

In FIG. 3(a), there is shown a schematic circuit diagram of a second embodiment of a delay gate 10a of the present invention and an associated truth table of the digital select signals S1–S5. It will be noted that the delay gate 10a of FIG. 3 is quite similar to the delay gate of FIG. 1 except that the upper control logic section 14 has been eliminated. In particular, the delay gate 10a is comprised of an inverter circuit section 13 and a control logic section 16a. The inverter circuit section 13 has an input node 18a and an output node 20a. The input node 18a is connectible to a buffer (not shown) for receiving the input logic signal $V_{in}$, and the output node 20a generates the output logic signal $V_{out}$.

The inverter circuit section 13 includes a plurality of parallel-connected CMOS inverters I1–I5. Each of the inverters I1–I5 is formed by a P-channel MOS transistor P1 and a respective one of the N-channel MOS transistors N1–N5. Accordingly, the inverter I1 is formed by the P-channel transistor P1 and the N-channel transistor N1 whose gates are connected together to form its input and whose drains are connected together to form its output. Similarly, the inverter I2 is formed by the P-channel transistor P1 and the N-channel transistor N2 whose gates are connected together to form its input and whose drains are connected together to form its output, and so on. The source of the P-channel transistor P1 is connected directly to the power supply potential VCC at node 28. The channel width-to-length ratio of the P-channel transistor P1 is 24:1 with the length being 1 micron. The channel width-to-length ratios of the N-channel transistors N1–N5 are 3:1, 4:1, 5:1, 6:1, and 7:1 respectively, with the length being 1 micron.

The control logic section 16a is comprised of gating transistors NS1–NS5. The conduction path of each of the gating transistors is connected between a respective one of the N-channel transistors of the inverter circuit section 13 and the ground potential at node 30. In particular, the gating transistor NSI has its drain connected to the source of the N-channel transistor N1 and its source connected to the ground potential. Similarly, the gating transistor NS2 has its drain connected to the source of the N-channel transistor N2 and its source connected to the ground potential, and so on. The gates of each of the gating transistors NS1–NS5 are connected to receive one of the respective digital select signals S1–S5. The sizes of the gating transistors N1–N5 are made to be larger relative to the inverter transistors N1–N5 so that when they are turned on their series resistance are quite negligible. For example, the channel width-to-length ratios of the gating transistors NS1–NS5 are shown to be 20:1 with the length being 1 micron.

As can be seen from line (1) of the truth table in FIG. 3(b), when the digital select signals S1–S3 are at a high logic level H and the digital select signals S4 and S5 are at a low logic level L, the ratio of the P-channel transistor size (P1) to the total N-channel transistor size (N1+N2+N3) will be approximately 24:12. For the other different codes of the digital select signals as shown in respective lines (2)–(9) of the truth table, there are shown the corresponding different ratios of the P-channel transistor size to the total N-channel transistor size. Generally, the ratio of 24:12, in line (1) being a ratio of 2:1 states that the size of the P-channel transistor is twice the total N-channel transistor size. In normal design process, this means that the input threshold voltage will be approximately one-half of the power supply potential VCC so as to assure maximum noise immunity. Typically, in CMOS circuitry the power supply voltage is approximately +5.0 volts and thus the input threshold voltage will be about +2.5 volts. As the ratio is gradually decreased as shown in the truth table of FIG. 3(b), the input threshold voltage of the delay gate 10a will be lowered in a step-wise fashion below +2.5 volts, thereby causing the propagation delay to decrease.

While the upper gating transistors psl-ps are shown as P-channel transistors and the lower gating transistor nsl-nsm are shown as N-channel transistors in FIG. 1, it should be clearly understood that this invention could be implemented by replacing the P-channel transistors with N-channel transistors and vice-versa, or by using other types of transistors. Further, all of the upper and lower gating transistors could alternatively be made as N-channel transistors or P-channel transistors.

From the foregoing detailed description, it can thus be seen that the present invention provides a CMOS delay gate whose propagation delay can be precisely controlled by digital select control signals. The delay gate includes an inverter circuit section formed of a plurality of P-channel and N-channel transistors and a control logic section which is responsive to the digital select control signals for changing the ratio of the total P-channel transistor size to the total N-channel transistor size. In this manner, the input threshold voltage of the inverter circuit section is selectively changed so as to produce a controllable propagation delay.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS digital-controlled delay gate comprising:
an inverter circuit section formed of a plurality of parallel-connected inverters (12a–12n) having their inputs connected to an input node for receiving an input logic signal and their outputs connected to an output node for generating an output logic signal, each of said plurality of inverters being formed of a P-channel transistor (p1–pl) and an N-channel transistor (nl–nm), each of said P-channel transistors and N-channel transistors having predetermined sizes;
a plurality of upper gating transistors (ps1–psl) having their conduction paths connected between a power supply potential (VCC) and a respective source electrode of said P-channel transistors of said plurality of inverters, each of said plurality of upper gating transistors having its gate connected to receive a corresponding one of first digital select signals (Sp1–Spl);
a plurality of lower gating transistors (ns1–nsm) having their conduction paths connected between a ground potential and a respective source electrode of said N-channel transistors of said plurality of inverters, each of said plurality of lower gating transistors having its gate connected to receive a corresponding one of second digital select signals (sn1–snm);
said first and second digital select signals having respective first and second numbers of different codes for selectively and independently turning on certain ones of said upper and lower gating transistors so as to enable at least one of the P-channel transistors and at least one of the N-channel transistors; and
said inverter circuit section having a variable threshold voltage which is substantially determined by the ratio of the total P-channel transistor size to the total N-channel transistor size of said enabled transistors so that said output logic signal has a controllable propagation delay relative to said input logic signal.

2. A delay gate as claimed in claim 1, wherein said plurality of upper and lower gating transistors are N-channel MOS transistors.

3. A delay gate as claimed in claim 1, wherein said plurality of upper gating transistors are P-channel MOS transistors, and wherein said plurality of lower gating transistors are N-channel MOS transistors.

4. A delay gate as claimed in claim 1, wherein said plurality of upper and lower gating transistors are P-channel MOS transistors.

5. A delay gate as claimed in claim 1, wherein said plurality of upper gating transistors are N-channel transistors, and wherein said plurality of lower gating transistors are P-channel MOS transistors.

6. A delay gate as claimed in claim 3, wherein the second number of different codes for said second digital select signals are completely independent of the first number of different codes for said first digital select signals.

7. A delay gate as claimed in claim 5, wherein the second number of different codes for said second digital select signals are completely independent of the first number of different codes for said first digital select signals.

8. A CMOS digital-controlled delay gate comprising:
an inverter circuit section formed of a plurality of parallel-connected inverters (I1–I5) having their inputs connected to an input node for receiving an input logic signal and their outputs connected to an output node for generating an output logic signal, each of said plurality of inverters being formed of at least one P-channel transistor (P1) and a plurality of N-channel transistors (N1–N5), said at least one P-channel transistor and said plurality of N-channel transistors having predetermined sizes;
said source electrode of said at least one P-channel transistor (P1) being connected to a power supply potential (VCC);
a plurality of gating transistors (NS1–NS5) having their conduction paths connected between a ground potential and a respective source electrode of said N-channel transistors of said plurality of inverters, each of said plurality of gating transistors having its gate connected to receive a corresponding one of digital select signals (SI–S5);
said digital select signals having a number of different codes for selectively turning on certain ones of said gating transistors so as to enable at least one of said plurality of N-channel transistors; and
said inverter circuit section having a variable input threshold voltage which is substantially determined by the ratio of the P-channel transistor size to the total N-channel transistor size of said enabled transistors so that said output logic signal has a controllable propagation delay relative to said input logic signal.

9. A delay gate as claimed in claim 8, wherein said plurality of gating transistors are N-channel MOS transistors.

10. A delay gate as claimed in claim 8, wherein said plurality of gating transistors are P-channel MOS transistors.

11. A CMOS digital-controlled delay gate comprising:

inverter circuit means (12) having an input node for receiving an input logic signal and an output node for generating an output logic signal, said inverter circuit means being formed of a plurality of parallel-connected P-channel transistors (p1-pl) and a plurality of parallel-connected N-channel transistor (n1-nm), each of said plurality of P-channel transistors and N-channel transistors having predetermined sizes;

control logic means (14, 16) responsive to digital select signals having a number of different codes for selectively and independently enabling certain ones of said plurality of P-channel transistors and certain ones of said plurality of N-channel transistors;

said inverter circuit means having a variable input threshold voltage which is substantially determined by the ratio of the total P-channel transistor size to the total N-channel transistor size of said enabled ones of said plurality of P-channel transistors and N-channel transistors so that said output logic signal has a controllable propagation delay relative to said input logic signal; and said control logic means including a plurality of lower gating transistors (ns1-nsm) having their conduction paths connected between a ground potential and a respective source electrode of said N-channel transistors and having its gate connected to receive a corresponding one of said digital select signals.

12. A delay gate as claimed in claim 11, wherein said control logic means includes a plurality of upper gating transistors (ps1-psl) having their conduction paths connected between a power supply potential and a respective source electrode of said P-channel transistors and having its gates connected to receive a corresponding one of said digital select signals.

13. A delay gate as claimed in claim 11, wherein said plurality of lower gating transistors are N-channel MOS transistors.

14. A delay gate as claimed in claim 12, wherein said plurality of upper gating transistors are P-channel MOS transistors.

15. A delay gate as claimed in claim 12, wherein said plurality of upper and lower gating transistors are N-channel MOS transistors.

16. A delay gate as claimed in claim 12, wherein said plurality of upper and lower gating transistors are P-channel MOS transistors.

17. A delay gate as claimed in claim 12, wherein said plurality of upper gating transistors are P-channel MOS transistors, and wherein said plurality of lower gating transistors are N-channel MOS transistors.

18. A delay gate as claimed in claim 12, wherein said plurality of upper gating transistors are N-channel MOS transistors, and wherein said plurality of lower gating transistors are P-channel MOS transistors.

* * * * *

UNITED STATES PATENT AND TRADEMARK OFFICE
CERTIFICATE OF CORRECTION

PATENT NO. :   5,227,679

DATED      :   July 13, 1993

INVENTOR(S) :  Ann K. Woo

It is certified that error appears in the above-identified patent and that said Letters Patent is hereby corrected as shown below:

Column 5, line 30, change "pO $P_x$" to -- $P_x$ --.

Signed and Sealed this

First Day of February, 1994

Attest:

BRUCE LEHMAN

*Attesting Officer*   *Commissioner of Patents and Trademarks*